United States Patent

Okabe et al.

[11] Patent Number: 4,839,510
[45] Date of Patent: Jun. 13, 1989

[54] OPTICAL SENSOR INCLUDING SHORTCIRCUIT PROTECTION HAVING NOTCHED ELECTRODE REGIONS

[75] Inventors: Kazuya Okabe, Furukawa; Yasuhiko Kasama; Hitoshi Seki, both of Izumi; Chisato Iwasaki, Furukawa, all of Japan

[73] Assignee: Alps Electric Co., Ltd., Japan

[21] Appl. No.: 160,703

[22] Filed: Feb. 26, 1988

[30] Foreign Application Priority Data

May 25, 1987 [JP] Japan .................. 62-127679

[51] Int. Cl.⁴ ............................................. H01J 40/14
[52] U.S. Cl. ................................. 250/211 J; 357/30
[58] Field of Search ............. 250/211 J, 211 K, 211 R; 357/30 D, 30 Q

[56] References Cited

U.S. PATENT DOCUMENTS

| | | | |
|---|---|---|---|
| 3,648,131 | 3/1972 | Stuby | 357/30 Q |
| 4,347,437 | 8/1982 | Mourou | 250/211 R |
| 4,376,285 | 3/1983 | Leonberger et al. | 357/30 Q |
| 4,431,914 | 2/1984 | Mourou et al. | 250/211 J |
| 4,781,442 | 11/1988 | Koster | 250/211 R |
| 4,782,222 | 11/1988 | Ragle et al. | 250/211 J |

Primary Examiner—David C. Nelms
Assistant Examiner—Stephone B. Allen
Attorney, Agent, or Firm—Guy W. Shoup; Paul J. Winters

[57] ABSTRACT

In an optical sensor, there is a risk that a short-circuit occurs in a gap between opposite electrodes on a photoconductive body. A pair of band-shaped electrodes each having a width of "W" are formed on the photoconductive body under the condition that these electrodes are positioned opposite to each other via the gap having an interval of "L". A band-shaped first notch portion having a length of "W/2" and a width of "L" is formed which is opened to the gap. Furthermore, a second notch portion is formed which is closed other than the portion thereof communicated to the first notch portion. Thus, first and second bridge portions are formed in one electrode where the first and second notch portions have been formed. When the opposite electrodes are shortcircuited, one of these bridge portions is cut out so that the tip portion of the cut electrode functions as another electrode.

6 Claims, 1 Drawing Sheet

OPTICAL SENSOR INCLUDING SHORTCIRCUIT PROTECTION HAVING NOTCHED ELECTRODE REGIONS

BACKGROUND OF THE INVENTION

1. Field of the Invention

The present invention relates to an optical sensor (photo-electric sensor) where the photoelectric effect of photoconductive materials is utilized.

2. Description of the Related Art

FIGS. 3 and 4 schematically illustrate a conventional optical sensor. In the figures, there is shown a substrate 1. A rectangular photoconductive body 2 is formed on this substrate 1. This photo-conductive body 2 is a thin film made of such materials as amorphous silicon hydroxide and cadmium sulfide. A pair of electrodes 3A and 3B which are shaped as a thin-film band, are provided on the photoconductive body 2 so as to derive photoelectric current under the condition that these electrodes 3A and 3B are positioned opposite to each other via a gap 4 having a predetermined interval "L". These electrodes 3A and 3B may be fabricated by employing the known thin-film forming means, e.g., a patterning method for evaporating a metal such as aluminium and for performing etching by way of photolithography, and a patterning method for evaporating aluminium via a metal mask.

In such a conventional optical sensor, the photoelectric current flows between the electrodes 3A and 3B in response to the intensities of light incident upon the gap 4. The photoelectric current "I" flowing through these electrodes 3A and 3B is directly proportional to a width "W" of each of the electrodes 3A and 3B, whereas the photoelectric current "I" is inversely proportional to the gap "L" between these electrodes. That is to say, $I \propto W/L$.

Moreover, the response speed "t" of the optical sensor is directly proportional to the 2nd power of the gap "L", or the squared gap "L"; namely, $t \propto L^2$.

Accordingly, to increase the photoelectric current without fabricating a large-sized optical sensor, the gap "L" is necessarily required to be made narrow in order to increase the response speed of the optical sensor. When the gap "L" between these electrodes 3A and 3B is made narrower, there is a risk that the electrodes 3A and 3B will be shortcircuited since these electrodes 3A and 3B are manufactured by way of the above-described thin-film fabricating means.

As a result, since, as previously described, the gap "L" between the electrodes 3A and 3B cannot be made considerably narrow, the large photoelectric current cannot be expected. Otherwise, the higher response speed cannot be realized.

SUMMARY OF THE INVENTION

The present invention has been accomplished in an attempt to solve the problems mentioned above. It is therefore an object of the invention to provide an optical sensor comprising a photoconductive body; a pair of band-shaped electrodes each having a width of "W", positioned opposite to each other on said photoconductive body via a gap having an interval of "L" defined by the opposite electrodes;

a band-shaped first notch portion having a length of "W/2" and also a width of "L", positioned at a substantially center of one of said opposite electrodes with being opened to said gap; and a second notch portion formed in said electrode under the condition that all of the second notch portion other than a portion thereof communicated with said first notch portion is closed.

Moreover, an optical sensor according to the invention is characterized by comprising a photoconductive body;

a pair of <-shaped electrodes each having a width of "W", positioned opposite to each other on said photoconductive body via first and second gaps each having an interval of "L" defined by the opposite electrodes;

a first notch portion having a width of "L" and a length greater than "W/2", positioned at a substantially center of one of said opposite electrodes with being opened to said two gaps; and a second notch portion formed in said electrode in such a manner that all of the second notch portion other than a portion thereof communicated with said first notch portion is closed.

With the above-described sensor arrangement, two sets of bridge portions are formed on the electrode by forming the second notch portion. As a consequence, the entire function of the optical sensor can be recovered by cutting one bridge portion by way of the laser trimming even when these electrodes are short-circuited, whereby the photoelectric current substantially equal to the conventional photoelectric current can be maintained.

BRIEF DESCRIPTION OF THE DRAWINGS

The above purpose and other useful and novel features of the present invention will become more readily apparent in the following description of the accompanying drawings, in which.

DETAILED DESCRIPTION OF THE INVENTION

Figure 3:
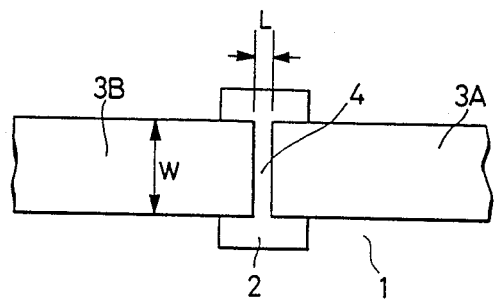
FIG. 3 is a plan view of the conventional optical sensor.
Figure 4:
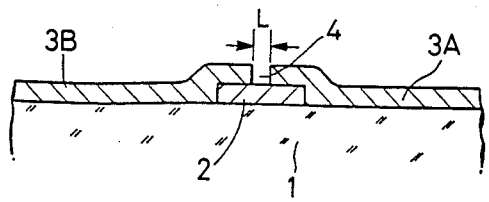
FIG. 4 is a sectional view of the conventional optical sensor.

It should be noted that the same reference numerals shown in FIGS. 3 and 4 will be employed as those for denoting the same elements shown in the following figures.

Figure 1:
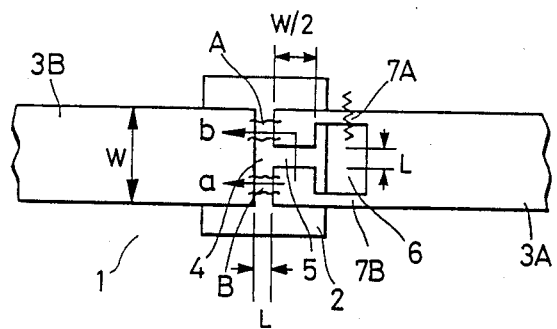
FIG. 1 is a plan view of an optical sensor according to a first preferred embodiment of the invention.

FIG. 1 schematically shows an optical sensor as a first preferred embodiment of the invention. A band-shaped first notch portion 5 is formed on a tip portion of one electrode 3A opposite to the gap 4, the first notch portion 5 being opened toward the gap 4. This first notch portion 5 is formed in such a manner that it is located at a center portion with respect to a width direction of the electrode 3A, a length of the first notch portion 5 perpendicular to the width direction of the electrode 3A is selected to be a half (½) of the full width (W) of the electrode 3A, and a width of the first notch portion 5 parallel to the width direction of the electrode 3A is equal to an interval "L" of the electrodes 3A and 3B. It should be understood that this first notch portion 5 must be positioned on the photoconductive body 2. In other words, even a portion of the first notch portion 5 is not strictly positioned outside the photoelectric body 2.

At an rear end of the first notch portion 5, a rectangular second notch portion 6 is formed which continues the first notch portion 5. A circumference of the second notch portion 6 except for the continuity thereof to the first notch portion 4, is closed, and a length of the second notch portion 6 in the width direction of the electrode 3A is made longer than the width "L" of the first notch portion 5.

Two sets of bridge portions 7A and 7B are formed on this electrode 3A by fabricating this second notch portion 6. The first and second bridge portions 7A and 7B can connect the tip portion of the electrode 3A where the first notch portion is formed, and a portion thereof which is located behind the second notch portion 6.

In the optical sensor with the above-described arrangement, when both the electrodes 3A and 3B are shortcircuited at a position denoted by "A" under the condition that the gap "L" between the electrodes 3A and 3B is made narrow, one of these bridge portion, e.g., the first bridge portion 7A is cut by way of the laser trimming. As a result, a tip portion of the electrode 3A cut out by the laser trimming can electrically function as the other electrode 3B. Then, the photoelectric current will flow from one electrode 3A to the other electrode 3B with two current streams, as illustrated by arrows λ and □ in FIG. 1. It should be understood that one photoelectric current in the λ direction is directly proportional to (W/2×1/L), whereas the other photoelectric current in the □ direction is directly proportional to (W/2×1/L), whereby both of the photoelectric current are directly proportional to the total photoelectric current (W/L). This implies that the photoelectric current of the shortcircuited optical sensor is substantially equal to that of the non-shortcircuited optical sensor Consequently, the conventional shortcircuit problem occurring between the electrodes 3A and 3B can be prevented when the large photoelectric current is desired with sufficiently narrowing the interval "L" of the gap 4.

It should be noted that when the shorcircuit is produced at a position indicated by "B" between the electrodes 3A and 3B as shown in FIG. 1, the second bridge portion 7B opposite to the first bridge portion is cut by the laser trimming.

Figure 2:
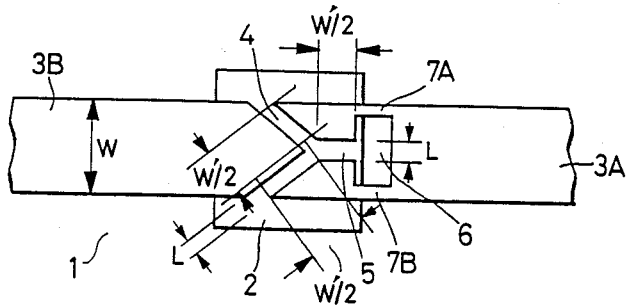
FIG. 2 is a plan view of an optical sensor according to a second preferred embodiment of the invention.

FIG. 2 schematically illustrates an optical sensor according to a second preferred embodiment of the invention. As easily seen from FIG. 2, the tip portions of a pair of the electrodes 3A and 3B are L-shaped, viewed in a plan view of FIG. 2. These tip portions are positioned opposite to each other. Intervals of the gap 4 defined between these electrodes 3A and 3B are maintained constant ("L") at any portion. Similarly, a width of the first notch portion is selected to "L", and also a length thereof is selected to be W'/2 in the second preferred embodiment. A particular advantage exists in that since there is a relationship of W<W', the larger photoelectric current can be obtained than that of the first optical sensor shown in FIG. 1. The shape defined between the electrodes may be a meander form which is widely employed in the optical sensor.

While has been described in detail, the optical sensor according to the invention can provide the following various merits, because a pair of band-shaped electrodes each having a width of "W" are formed on the photoconductive body under the condition that these electrodes are positioned opposite to each other via the gap having an interval of "L", the band-shaped first notch portion having a length of "W/2" and a width of "L" is formed which is opened to the gap, and also the second notch portion is formed which is closed other than the portion thereof communicated to the first notch portion. That is to say, since the drawback of the shortcircuit occurring between the electrodes can be avoided while narrowing the interval of the gap between electrodes, the resultant gap can be sufficiently made narrow. As a result, the larger photoelectric current can be obtained and also the high response speed can be realized. Moreover, as the shortcircuit problem occurring between the electrodes can be prevented, the manufacturing yield can be increased. Then, according to the optical sensor, the large photoelectric current can be achieved with the higher response speed so that the characteristics of the optical sensor are improved, and the shorcircuit occurring between these electrodes may be reduced and also the production yield can be improved.

What is claimed is:

1. An optical sensor comprising:
   a photoconductive body;
   a pair of band-shaped electrodes each having a width of "W", positioned opposite to each other on said photoconductive body via a gap having an interval of "L" defined by the opposite electrodes;
   a band-shaped first notch portion having a length of "W/2" and also a width of "L", positioned at a substantially center of one of said opposite electrodes with being opened to said gap; and
   a second notch portion formed in said electrode under the condition that all of the second notch portion other than portion thereof communicated with said first notch portion is closed.

2. An optical sensor as claimed in claim 1, wherein said electrodes are formed by employing a patterning method where a metal is evaporated and then etched by way of photo-lithography.

3. An optical sensor as claimed in claim 1, where said electrodes are formed by employing a patterning method where a metal is evaporated via a metal mask.

4. An optical sensor comprising:
   a photoconductive body;
   a pair of <-shaped electrodes each having a width of "W", positioned opposite to each other on said photoconductive body via first and second gaps each having an interval of "L" defined by the opposite electrodes;
   a first notch portion having a width of "L" and a length greater than "W/2", positioned at a substantially center of one of said opposite electrodes with being opened to said two gaps; and
   a second notch portion formed in said electrode in such a manner that all of the second notch portion other than a portion thereof communicated with said first notch portion is closed 5. An optical sensor as claimed in claim 4, wherein said electrodes are formed by employing a patterning method where a metal is evaporated and then etched by way of photo-lithography.

6. An optical sensor as claimed in claim 4, wherein said electrodes are formed by employing a patterning method where a metal is evaporated via a metal mask.

* * * * *